(12) United States Patent
Elison et al.

(10) Patent No.: US 8,911,244 B2
(45) Date of Patent: Dec. 16, 2014

(54) RECEPTACLE WITH HEAT MANAGEMENT FOR ELECTRONIC AND OPTICAL SYSTEMS

(71) Applicant: International Business Machines Corporation, Armonk, NY (US)

(72) Inventors: Bret P. Elison, Rochester, MN (US); Phillip V. Mann, Rochester, MN (US); Arden L. Moore, Cedar Park, TX (US); Arvind K. Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 74 days.

(21) Appl. No.: 13/713,294

(22) Filed: Dec. 13, 2012

(65) Prior Publication Data

US 2014/0170898 A1    Jun. 19, 2014

(51) Int. Cl.
*H01R 13/44* (2006.01)
*H05K 7/20* (2006.01)

(52) U.S. Cl.
CPC .................................. *H05K 7/20409* (2013.01)
USPC .......................................................... 439/137

(58) Field of Classification Search
USPC .......................................................... 439/137
See application file for complete search history.

(56) References Cited

U.S. PATENT DOCUMENTS

| | | | |
|---|---|---|---|
| 6,278,610 B1 * | 8/2001 | Yasufuku et al. | 361/704 |
| 6,280,222 B1 | 8/2001 | Walkup | |
| 6,942,506 B2 * | 9/2005 | Kimura et al. | 439/159 |
| 7,133,285 B2 * | 11/2006 | Nishimura | 361/715 |
| 7,187,552 B1 * | 3/2007 | Stewart et al. | 361/704 |
| 7,272,009 B2 | 9/2007 | Sura et al. | |
| 7,281,862 B2 | 10/2007 | Oen et al. | |
| 7,448,921 B2 * | 11/2008 | Kim et al. | 439/744 |
| 7,542,294 B2 | 6/2009 | Caines et al. | |
| 7,733,652 B2 * | 6/2010 | Costello et al. | 361/704 |
| 7,785,124 B2 | 8/2010 | Lin et al. | |
| 7,869,215 B2 * | 1/2011 | Hung et al. | 361/704 |
| 7,946,881 B2 | 5/2011 | Hsieh et al. | |
| 7,974,098 B2 * | 7/2011 | Oki et al. | 361/715 |
| 8,081,470 B2 | 12/2011 | Oki et al. | |
| 8,113,853 B2 | 2/2012 | Coyle, Jr. et al. | |
| 2005/0074995 A1 * | 4/2005 | Kimura et al. | 439/159 |
| 2005/0162834 A1 * | 7/2005 | Nishimura | 361/710 |
| 2009/0296351 A1 * | 12/2009 | Oki et al. | 361/709 |
| 2010/0067196 A1 * | 3/2010 | Costello et al. | 361/704 |
| 2012/0052720 A1 | 3/2012 | David et al. | |

OTHER PUBLICATIONS

"Gap Pad VO: Data Sheet", © 2012 The Bergquist Company, Chanhassen, MN. www.bergquistcompany.com.

* cited by examiner

*Primary Examiner* — Ross Gushi
(74) *Attorney, Agent, or Firm* — Peder M. Jacobson; Robert R. Williams

(57) ABSTRACT

An apparatus that is a receptacle adapted for receiving a connector. The apparatus may further include a hinged heat sink included in the receptacle. The hinged heat sink adapted in an open position for insertion and removal of a cable. The hinged heat sink further adapted in a closed position to make thermal contact with a thermally active location of the connector wherein a thermal path is provided for a dissipation point on the outside of the electronic receptacle.

8 Claims, 3 Drawing Sheets

RECEPTACLE WITH HEAT MANAGEMENT FOR ELECTRONIC AND OPTICAL SYSTEMS

TECHNICAL FIELD

Embodiments described herein generally relate to electronic connectors, and more specifically, to heat management for electronic connectors.

BACKGROUND

Electronic connectors may allow for electronic signals to be passed from one carrier or generator to another. The electronic connectors may be used to assist connecting and routing electronic transmission into individual devices or vast networks. Electronic connectors may also be used with electronic cables so that communication can occur between two or more devices. This may also allow for the creation of a network that may carry or transmit a multitude of signals to a variety of senders and receivers of such signals. For example, the use of a network cable and connector allows the signal being transmitted over the network cable to be routed through larger network systems that the connector may enable the network cable to interface with.

SUMMARY

In one embodiment, an apparatus that is a receptacle adapted for receiving a connector. The apparatus may further include a hinged heat sink included in the receptacle. The hinged heat sink adapted in an open position for insertion and removal of a cable. The hinged heat sink further adapted in a closed position to make thermal contact with a thermally active location of the connector wherein a thermal path is provided for a dissipation point on the outside of the electronic receptacle.

BRIEF DESCRIPTION OF THE DRAWINGS

In the Figures and the Detailed Description, like numbers refer to like elements.

DETAILED DESCRIPTION

Figure 1:
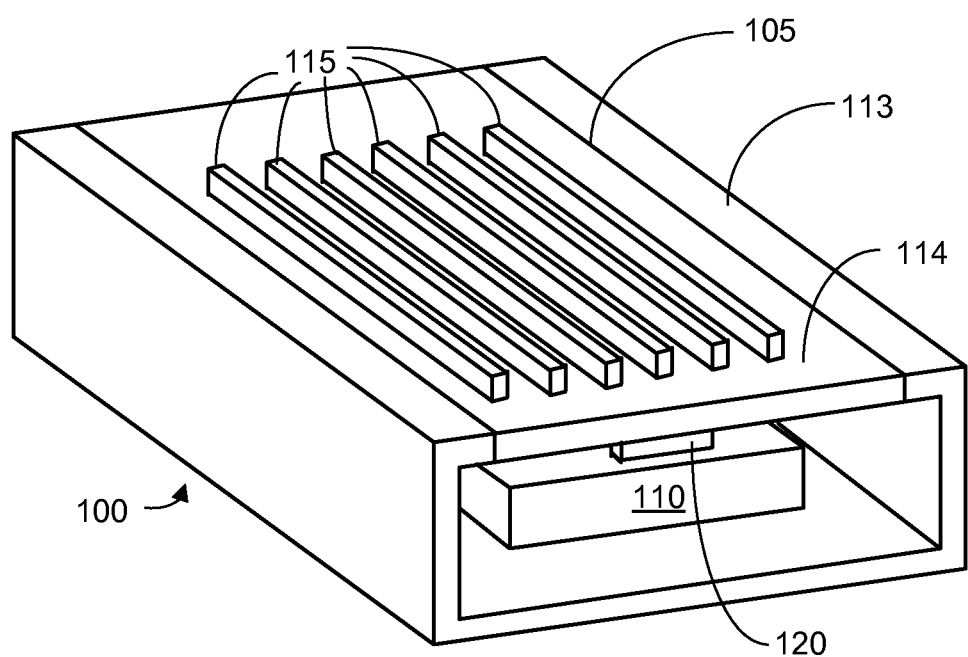
FIG. 1 shows a schematic representation of an electronic component according to one embodiment of the invention.

Often electronic devices are designed to communicate with other electronic devices. The communication may be accomplished by transmitting signals through electronic cables. In order for the electronic devices to use the electronic cables the devices may require electronic connectors and receptacles. These connectors and receptacles may create a physical connection with the cables allowing for device signals to be sent and received through the cables. For example, the connector may be plugged into the receptacle to make electronic or optical connections. The term connector as used herein refers to the end of the cable that may be inserted into a receiving body. The term receptacle refers to the body receiving the end of cable. Those of skill in the art to practice the invention may use the terms interchangeably or may use the term connector to refer to the combination of connector and receptacle.

The connectors, receptacles, or cables may also include components that organize or transform the signal from the electronic device to a signal that may be used by the connected electronic cable. In one embodiment, this may be transforming a signal, or communication, between signal forms or types. For example, the signal may have a form that uses a combination of three wires and be transformed to a signal form that uses four wires. In another embodiment, the signal may be transformed between forms that are electronic to one that is optical in nature such as fiber optic transmissions.

Embodiments of electronic connectors, receptacles, and cables that may have transformative elements may be known as active connectors, receptacles, and cables. For example, a fiber optic cable may have circuitry or electronics within connectors built into or attached at one or both ends of the cable that may transform the signals of light passing through the cable into electric signals. The transformed signals may then be transferred between the connector and receptacle. The presence of the circuitry or electronics may result in the fiber optic cable being known as an active cable or a cable with an active element. Active cables, connectors, and receptacles may generate heat. The heat may be created by the elements within the cable, connector, or receptacle that are transformative as the transformation process done by them may generate heat. For example, an active optic cable may have electronics at the end, or connector, of the cable that may transform the optical signal in the cable to an electronic one. The electronics that do the transforming of the signal may generate heat in the transformation process. This heat may require management in the receptacle the connector plugs into.

Often the heat generated must be removed from a cable, connector, receptacle, or their immediate area in order for them to maintain an operational temperature within desired limits. Failure to remove heat effectively results in increased temperatures, which in turn, may lead to thermal runaway conditions causing decreased performance and potentially catastrophic failure of elements within the cable, connector, or receptacle. A runaway thermal condition may also result in the damaging of housing and insulation of the cable, connector, or receptacle. In extreme cases runaway thermal conditions may create a fire risk. Thermal management is the process of maintaining a desirable temperature in electronic devices and their surroundings.

Features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments may be practiced and to further enable those of skill in the art to practice the invention. It is also to be understood that the descriptions of the embodiments are provided by way of example only, and are not intended to limit the scope of this invention as claimed.

FIG. 1 is one embodiment of an electronic receptacle 100 with thermal management. The thermal management may be accomplished by a hinged heat sink 105. The hinged heat sink 105 may use one or more heat conductive fins 115 on the top of a levered plate 114 of electronic receptacle 100. The hinged heat sink 105 may be lifted away from receptacle body 113 so that an electronic cable or cable connector attached to a cable may be inserted or removed from the electronic receptacle 100. The hinged heat sink 105 may latch onto the cable using latch 120. The receptacle 100 may have receptacle electronic interface element 110 that may interface with a connector or cable when installed in the receptacle 100. In various embodiments, the receptacle electronic interface element 110 may have or be made of one or more conductive plates or wires for sending or receiving electronic signals. In other embodiments, the receptacle electronic interface element 110 may contain elements for sending and receiving signals sent optically. In another embodiment, the receptacle electronic interface element 110 may instead be a optical interface element. In other embodiments, the receptacle electronic interface element 110 may combine several types and shapes of the previously mentioned elements for sending or receiving signals. In various embodiments, the receptacle 100 may have a multitude of receptacle electronic interface elements 110. The variation and combinations possible of receptacle electronic interface elements 110 would be apparent to one skilled in the art.

The fins 115 may be thermally connected to elements that pass through the levered plate 114 of the hinged heat sink 105 and connected to elements of the hinged heat sink 105 that may make a thermal path from a cable or connector insert into the receptacle 100 to the fins 115. The fins 115 and heat transfer elements in the body of the hinged heat sink 105 may allow for thermal management by using the thermal path that allows for heat to travel away from the end of the cable, connector, or the internal elements of receptacle 100. The path may end at the fins 115 where the heat may dissipate into the ambient air, for example.

Figure 2A:
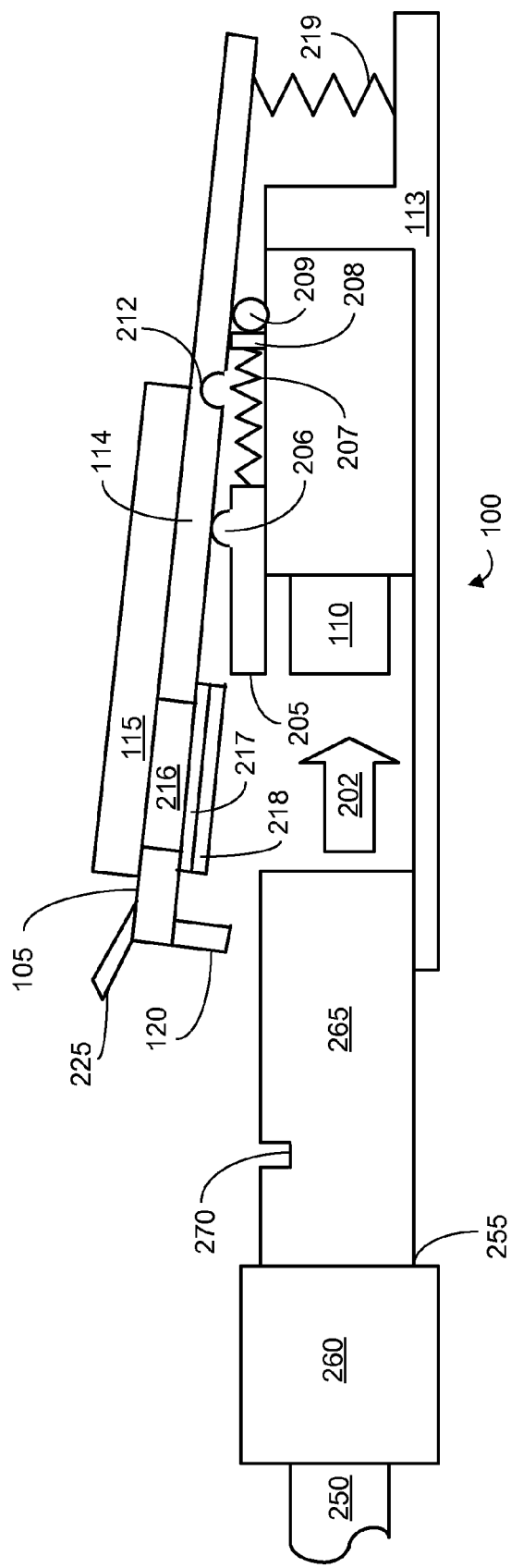
FIG. 2A shows a schematic representation of an electronic component positioned to be installed into a receptacle, according to one embodiment of the invention.
Figure 2B:
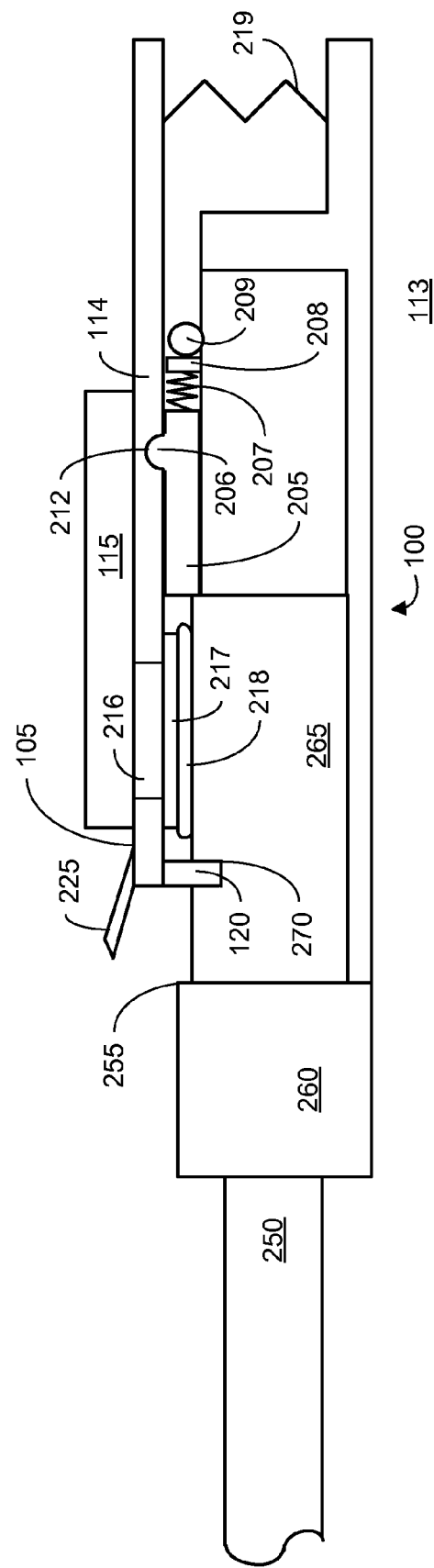
FIG. 2B shows a schematic representation of an electronic component installed in the receptacle of FIG. 2A, according to one embodiment of the invention.

FIGS. 2A and 2B are cross sectional views of an exemplary electronic cable 250 and an electronic receptacle 100. In FIG. 2A, the electronic connector 255 at the end of electronic cable 250 is oriented for installation in an electronic receptacle 100 with an arrow 202 indicating the direction of insertion. FIG. 2B shows the same embodiment with the electronic connector 255 installed in receptacle 110.

In FIG. 2A a hinged heat sink 105 has hinge 209 and is tilted open by the ridge 206 of slider 205 that the levered plate 114 rests against. The compressed actuation spring 219 creating a closing force on the levered plate 114, but the hinged heat sink may not close until the slider 205 is in a proper position. In various other embodiments, the hinge 209 may have an internal spring loaded mechanism that resists the opening of the hinged heat sink 105 eliminating the need for actuation spring 219 in some of these embodiments. The use of the hinge 209 and actuation spring 219 may keep the levered plate 114 resting against ridge 206. In other embodiments the hinge may be part of the levered plate 114, hinged heat sink 105, or receptacle body 113 instead of a separate mechanical element. For example, the hinge may be a flexible plastic or rubber section molded into the receptacle body 113 or levered plate 114. In such an embodiment, the levered plate 114, receptacle body 113, and hinge 209 may all be a single molded piece.

Slider 205 may be used to keep the hinged heat sink 105 in an open position when a cable connector 255 is not inserted into the receptacle 100. In the open position the ridge 206 on slider 205 is away from groove 212. The spring 207 may be positioned between slider 205 and spring base 208. The positioning of the slider 205 and the spring base 208 may result in the ridge 206 being away from notch 212 when the spring is in a relaxed state. The spring 207 may be collapsed as the slider moves back under pressure from an inserted connector 255 as discussed below. In various embodiments, the spring base 208 may be part of the hinge 209 or part of the receptacle body 113.

The hinged heat sink 105 may have fins 115 as previously discussed for dispersion of heat from the connector 255, cable 250, or receptacle 100. Heat may be transferred to the fins 115 through the levered plate 114 of the hinged heat sink 105 by heat path element 216. The heat path element 216 may be a made of one or more pieces that pass through levered plate 114 and connect the fins 115 with a heat receiving plate 217. The heat receiving plate 217 may provide a base for and receive heat from conformable heat transfer material 218. The conformable heat transfer material 218 may contact and conform to electronic connector interface element 265 when it is installed into the receptacle 100. In various embodiments, the conformable heat transfer material may conform or be in contact with the cable 250, connector 255, connector electronic interface element 265, or receptacle electronic interface element 110. In various embodiments, one or more heat receiving plates 217 may be used. In various embodiments, the fins 115, heat path element 216, or heat receiving plate 217 may be combined into a single piece as part of the hinged heat sink 105.

The hinged heat sink 105 may have latch 120 which may insert into latch receptacle 270 on cable connector 255. The latch 120 and latch receptacle 270 may assist in locking the connector 255 into an installed position in the receptacle 100. For example, the latch 120 when inserted into latch receptacle 270 may assist in countering the outward force created by the compressed spring 207 when a connector 255 is installed. In various embodiments, a variety of types of latches 120 and latch receptacles 270 may be used. In other embodiments, the location of the latch 120 and latch receptacle 270 may be varied between the hinged heat sink 105, the receptacle body 113, the connector 255, the connector grip 260, the connector electronic interface element 265, or cable 250. These variations would be apparent to one skilled in the art.

The receptacle 100 has a receptacle electronic interface element 110 that may interface with the connector electronic interface element 265 when the connector 255 is installed in the receptacle 100. The receptacle electronic interface element 110 may have a variety of forms, shapes, and elements as previously mentioned. The connector electronic interface element 265 may be made of or include one or more conductive plates or wires for sending or receiving electronic signals. In other embodiments, the connector electronic interface element 265 may contain elements for sending and receiving signals sent optically. In other embodiments, the connector electronic interface element 265 may combine several types and shapes of the previously mentioned elements for sending or receiving signals. In various embodiments, the connector 255 may have a multitude of connector electronic interface elements 110. The variation and combinations possible of connector electronic interface elements 265 would be apparent to one skilled in the art. The connector electronic interface element 265 may be shaped or formed such that elements that are part of it for sending or receiving signals may be paired with elements of the receptacle electronic interface element 110. In various embodiments, the receptacle electronic interface element 110 and connector electronic interface element 265 may connect, clamp, envelop, embrace, or interface with each other when the connector 255 is inserted into the receptacle 100.

In FIG. 2B the electronic connector 255 is installed in receptacle 110 and the receptacle electronic interface element 110 is embraced by the connector electronic interface element 265. This view may illustrate the interaction between elements of the connector 255 and receptacle 100 once the connector 255 is installed. The illustrated interactions between elements of the design may also include interactions involving the hinged heat sink 105 that include the levered plate 114, the heat path through the levered plate 114, and the receptacle electronic interface element 110, and the slider 205.

In the illustrated embodiment, the latch 120 is in the closed position in the latch receptacle 270. In this position the latch 120 may lock the connector 255 into the receptacle 100. The hinged heat sink 105 may be raised by lifting the lift tab 225. This may release the connector 255 from the receptacle 100 so that it may be uninstalled.

In the illustrated embodiment, the installed connector 255 may push the slider 205 backward compressing the spring 207. With the slider 205 moved back the ridge 206 may enter groove 212 on the levered plate 114. When the ridge 206 is in the groove 212 the levered plate 114 may be lowered into an approximately parallel position with the inserted connector 255 allowing for closure of the hinged heat sink 105 of receptacle 100 onto the connector 255. In this position actuation spring 219 may either be in a relaxed state or may be slightly compressed still. In various embodiments, the actuation spring 219 may provide compression force to conformable thermal interface element 265 against connector 255.

The heat path from the connector 255 to the fins 115 can clearly be seen with the hinged heat sink 105 in the closed position. With the hinged heat sink 105 in the closed position the conformable heat transfer material 218 may be pressed against and conform to the connector electronic interface element 265. The conformable thermal interface material 218 may be adapted to embrace parts or elements of the connector 255, connector electronic interface element 265, or receptacle electronic interface element 110 that it may be in contact with when the hinged heat sink 105 is in a closed position. In various embodiments the conformable thermal interface material 218 may be omitted and the heat receiving plate 217 may be in contact with the cable 250, connector 255, connector electronic interface element 265, or receptacle electronic interface element 110.

The ability of the conformable thermal interface material 218 to conform around devices or elements may provide a larger contact area for heat conduction than designs without the conformable thermal interface material 218. The contact provided may be larger than use of only a heat receiving plate 217 used in other embodiments. The heat receiving plate 217 without the conformable thermal interface material 218 may provide limited contact with elements it should make contact with. The lack of conformability of the heat receiving plate 217 may result in limited contact due to variations in size of elements due to manufacturing tolerances and deformation caused by multiple installations and removals of components.

In one embodiment, the conformable thermal interface material 218 may use, or be formed from, a thermally conductive polymeric composite material. One example material that may be used to form the conformable thermal interface sleeve 310 is a Gap Pad VO®, by the Berquist Company of Chanhassen, Minn. It has a thermal conductivity of 0.8 W/m-K and a Young's modulus, the measure of elasticity, of 100 kPa. These properties give it both acceptable heat transfer capabilities and an ability to conform to the unevenness and changing topography of connector 255 or receptacle 100 parts it contacts. It is contemplated that other suitable materials may be used for the conformable thermal interface material 218, including gels or viscous liquids, and may still remain within the scope and spirit of the present invention.

As previously mentioned the conformable thermal interface material 218 may be in contact with a heat receiving plate 217. The heat receiving plate 217 may be in contact with the heat path element 216. The heat path element 216 may pass through the levered plate 114 and create a thermal path between the heat receiving plate 217 and the fins 115. The thermal path may provide a path for heat in parts in contact with the conformable thermal interface material 218 to be dispersed by the fins. This may allow the hinged heat sink 105 to assist in providing thermal management for the cable 250, connector 255, or receptacle 100.

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope and spirit of the disclosed subject matter.

What is claimed is:

1. An apparatus, comprising:
a receptacle including:
a receptacle body;
a hinged heat sink pivotable between an open position and a closed position, the hinged heat sink approximately parallel with a base wall of the receptacle body in the closed position and non-parallel with the base wall in the open position, the hinged heat sink and receptacle body defining a space in the receptacle for receiving a connector; and
a slider having a ridge, the slider mounted adjacent to the hinged heat sink within the space such that the ridge is in contact with the hinged heat sink, the slider moveable along a direction of insertion of the connector, the slider moveable between a default position, where the ridge tilts the hinged heat sink into the open position, and a locked position, where the ridge enters a groove in the hinged heat sink allowing the hinged heat sink to pivot into the closed position, the slider connected to a spring resisting movement of the slider into the locked position, the slider and the spring positioned such that insertion of the connector moves the slider into the locked position;
wherein the receptacle is adapted for insertion and removal of the connector when the hinged heat sink is in the open position, and adapted to make thermal contact with the connector when the hinged heat sink is in the closed position, and wherein a thermal path is provided for a dissipation point on the outside of the receptacle.

2. The apparatus of claim 1, further comprising:
a latch mechanism built into the receptacle such that the receptacle locks onto the connector when fully inserted into the receptacle.

3. The apparatus of claim 2, further comprising a latch release mechanism built into the receptacle.

4. The apparatus of claim 2, wherein the latch is built into the hinged heat sink.

5. The apparatus of claim 4, further comprising a latch release mechanism built into the hinged heat sink.

6. The apparatus of claim 1, wherein the dissipation point includes one or more fins on a side of the hinged heat sink opposite to the space, and wherein the thermal path is, in the closed position, perpendicular to the receptacle body, the hinged heat sink, and an interface portion of the connector.

7. The apparatus of claim 6, wherein the thermal path includes a conformable thermal interface material contacting the interface portion of the connector.

8. The apparatus of claim 7, wherein the conformable thermal interface material has a contact surface having a profile sculpted to conform to a configuration of the connector.

* * * * *